(12) United States Patent
Kropp

(10) Patent No.: US 6,973,248 B2
(45) Date of Patent: Dec. 6, 2005

(54) PLANAR OPTICAL COMPONENT, AND A COUPLING DEVICE FOR COUPLING LIGHT BETWEEN A PLANAR OPTICAL COMPONENT AND AN OPTICAL ASSEMBLY

(75) Inventor: Jörg-Reinhard Kropp, Berlin (DE)

(73) Assignee: Infineon Technologies AG, Munich (DE)

( * ) Notice: Subject to any disclaimer, the term of this patent is extended or adjusted under 35 U.S.C. 154(b) by 180 days.

(21) Appl. No.: 10/277,124

(22) Filed: Oct. 21, 2002

(65) Prior Publication Data

US 2004/0033016 A1 Feb. 19, 2004

(30) Foreign Application Priority Data

Aug. 19, 2002 (DE) .................................. 102 37 741

(51) Int. Cl.[7] .............................................. G02B 6/10
(52) U.S. Cl. ...................................... 385/131; 385/901
(58) Field of Search .......................... 385/14, 129–132, 385/31, 89, 47, 901

(56) References Cited

U.S. PATENT DOCUMENTS

| | | | |
|---|---|---|---|
| 4,966,430 A | | 10/1990 | Weidel |
| 5,432,876 A | * | 7/1995 | Appeldorn et al. ........... 385/31 |
| 5,600,741 A | * | 2/1997 | Hauer et al. .................. 385/35 |
| 5,901,262 A | * | 5/1999 | Kobayashi et al. ........... 385/89 |
| 5,966,478 A | * | 10/1999 | Marcuse et al. .............. 385/14 |
| 6,285,808 B1 | * | 9/2001 | Mehlhorn et al. ............. 385/14 |
| 6,302,590 B1 | * | 10/2001 | Moore .......................... 385/53 |
| 6,370,292 B1 | * | 4/2002 | Strake .......................... 385/14 |
| 6,422,761 B1 | * | 7/2002 | Naghski et al. ............... 385/73 |
| 6,491,447 B2 | * | 12/2002 | Aihara ......................... 385/92 |
| 6,493,489 B2 | * | 12/2002 | Mertz et al. .................. 385/52 |
| 6,862,382 B2 | * | 3/2005 | Wang et al. .................. 385/31 |
| 2002/0081078 A1 | * | 6/2002 | Melchior et al. ............. 385/89 |
| 2002/0176671 A1 | * | 11/2002 | Toume ......................... 385/88 |

(Continued)

FOREIGN PATENT DOCUMENTS

DE 38 34 335 A1 4/1990

(Continued)

Primary Examiner—Karl D. Frech
Assistant Examiner—Daniel Walsh
(74) Attorney, Agent, or Firm—Laurence A. Greenberg; Werner H. Stemer; Ralph E. Locher

(57) ABSTRACT

A multilayer planar optical component has a multiplicity of optical conductors. Each optical conductor is assigned a deflecting device that launches or couples out light at an angle to a longitudinal direction of the respective optical conductor, and the deflecting devices form a two-dimensional grid in the projection onto a plane parallel to the surface of the planar optical component. A coupling device for coupling light between such a planar optical component and an optical assembly has a lens array with a multiplicity of lenses disposed along a two-dimensional grid.

20 Claims, 6 Drawing Sheets

U.S. PATENT DOCUMENTS

| | | | |
|---|---|---|---|
| 2003/0152330 A1 * | 8/2003 | Greene et al. | 385/52 |
| 2003/0174946 A1 * | 9/2003 | Viens | 385/37 |
| 2003/0180002 A1 * | 9/2003 | Nishimura | 385/48 |
| 2003/0198439 A1 * | 10/2003 | Hiramatsu | 385/39 |
| 2004/0096152 A1 * | 5/2004 | Nakama et al. | 385/31 |
| 2004/0105648 A1 * | 6/2004 | Brooks et al. | 385/137 |
| 2004/0109627 A1 * | 6/2004 | Kim et al. | 385/14 |
| 2004/0109628 A1 * | 6/2004 | Kim et al. | 385/14 |
| 2004/0114866 A1 * | 6/2004 | Hiramatsu | 385/39 |
| 2004/0131302 A1 * | 7/2004 | Kouta et al. | 385/14 |
| 2004/0197054 A1 * | 10/2004 | Toume | 385/88 |

FOREIGN PATENT DOCUMENTS

| | | |
|---|---|---|
| DE | 42 06 358 C1 | 1/1993 |
| DE | 197 43 992 C1 | 6/1999 |
| DE | 199 32 907 C2 | 2/2001 |
| DE | 100 54 370 A1 | 5/2002 |
| EP | 1 004 907 A2 | 5/2000 |
| JP | 09 270 751 A | 10/1997 |
| WO | 97/31280 | 8/1997 |

* cited by examiner

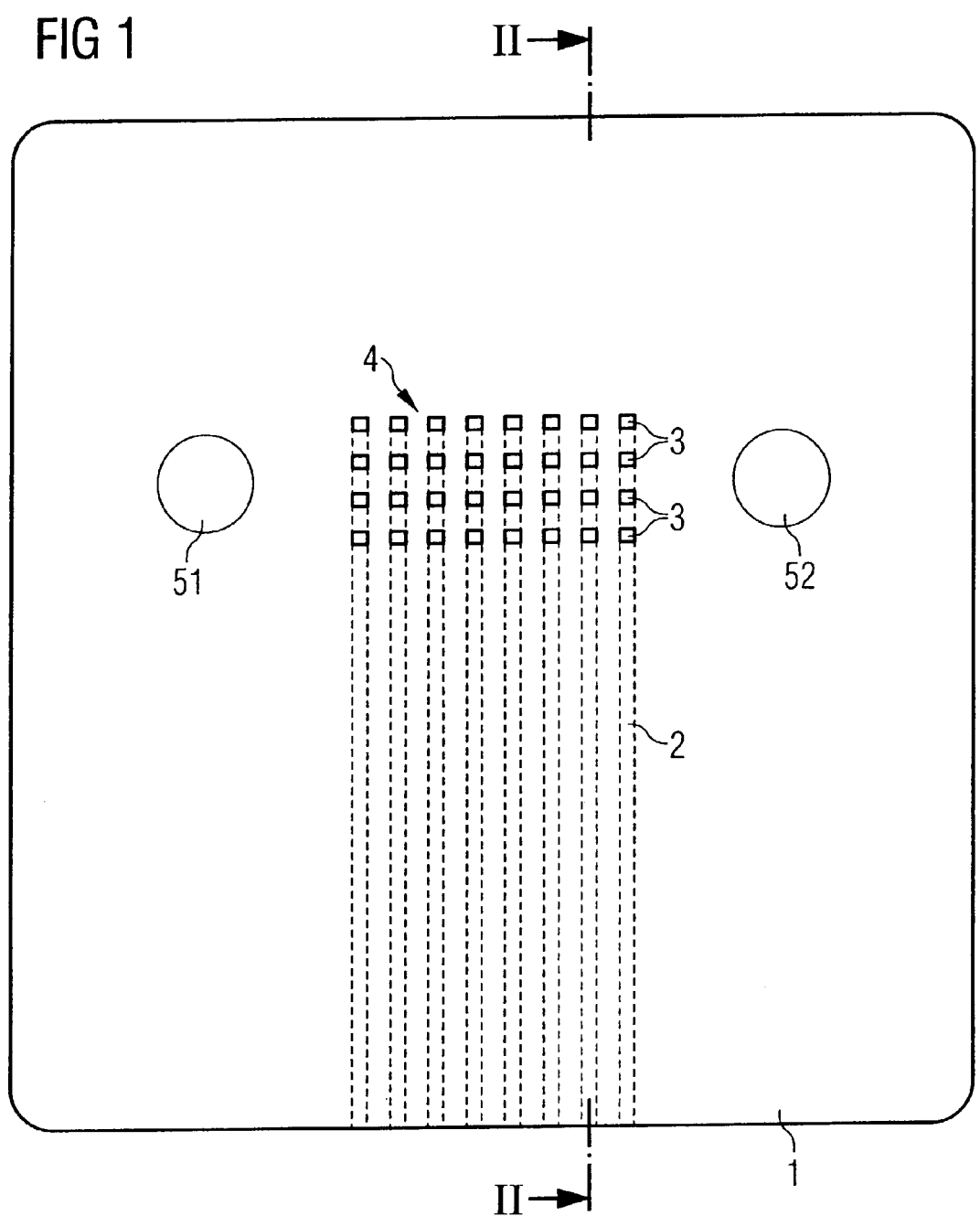

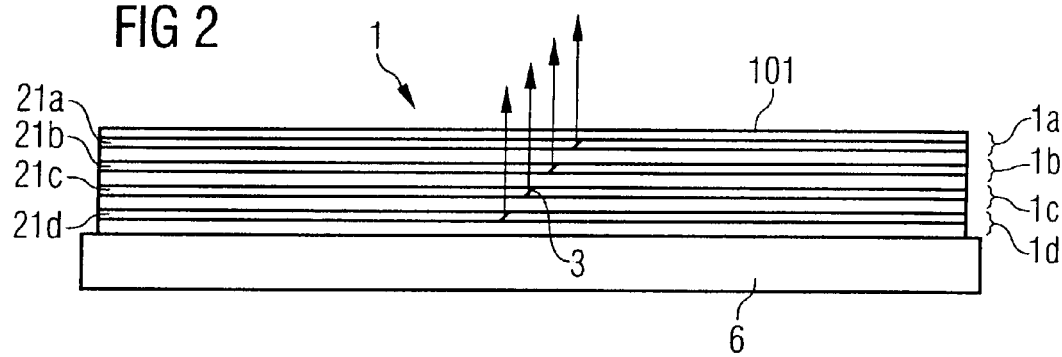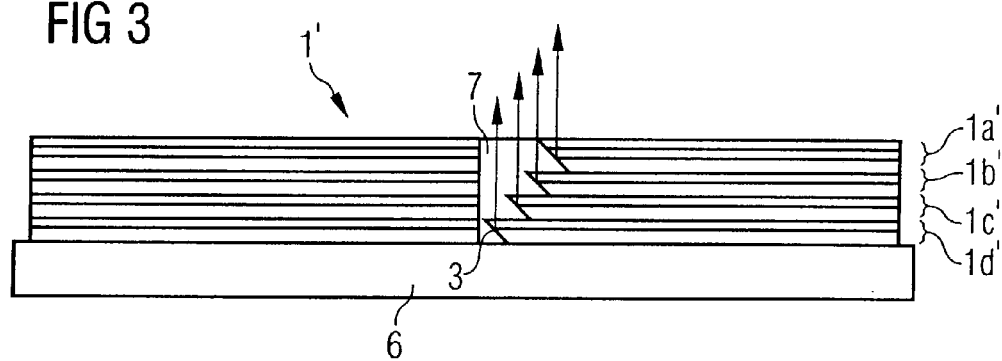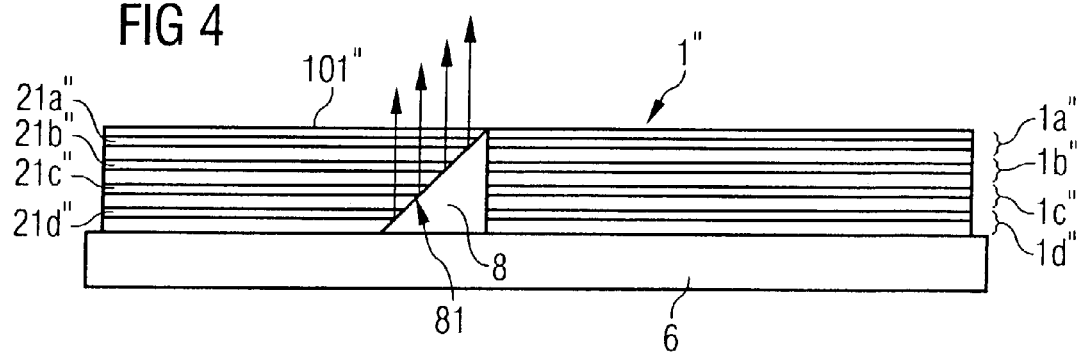

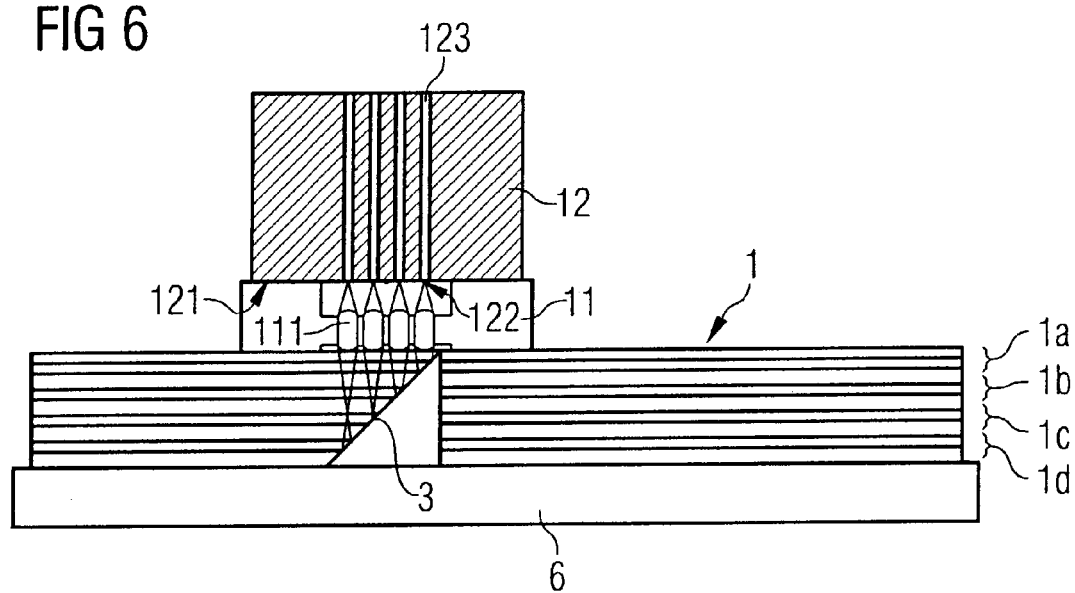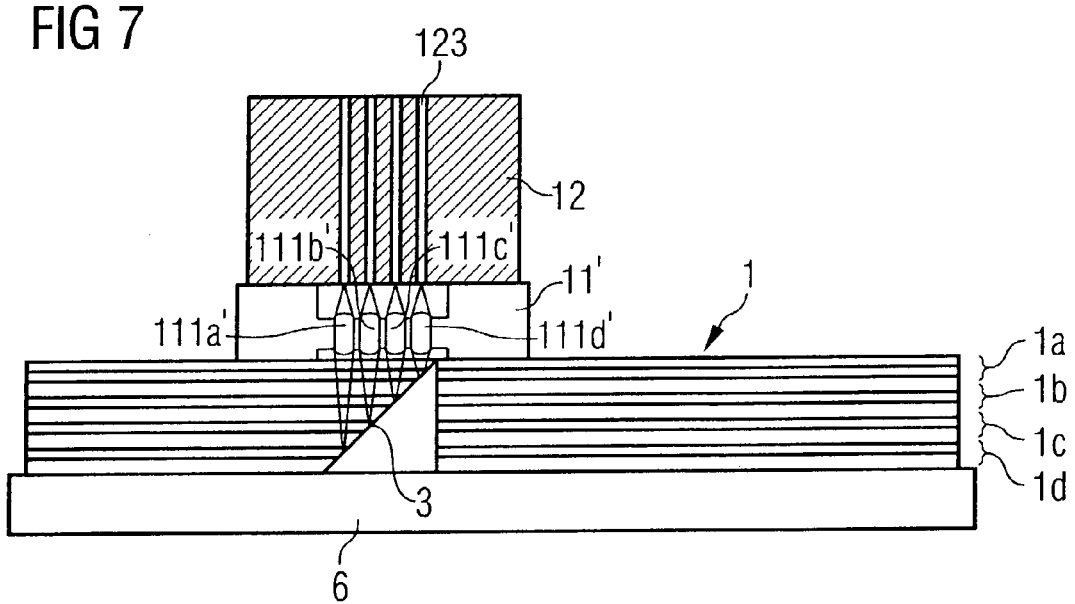

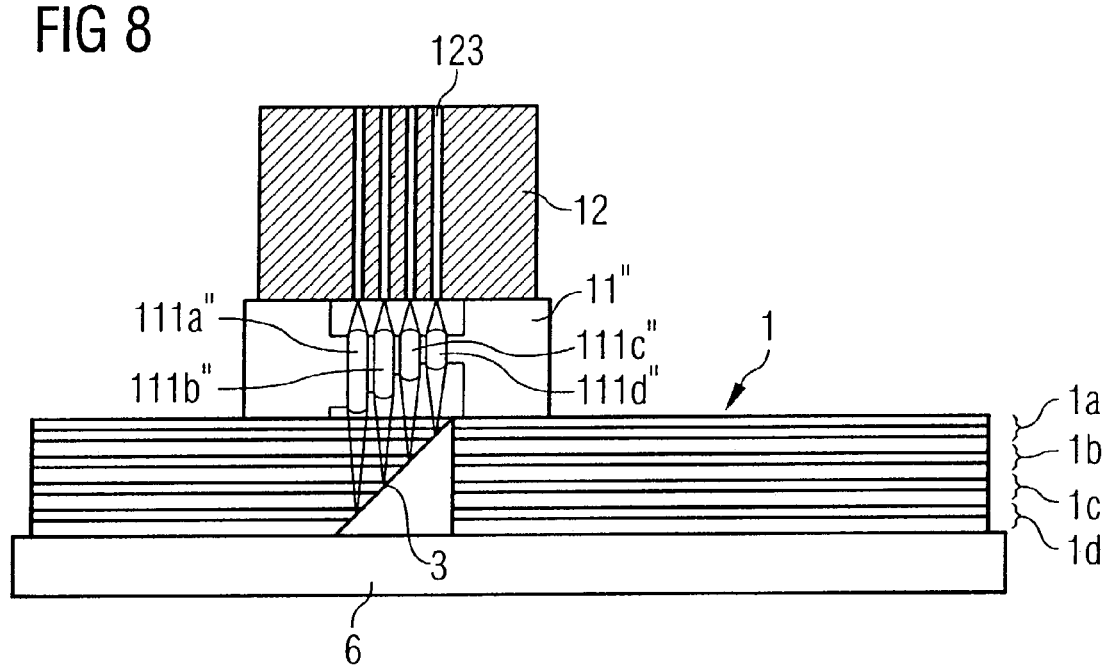

PLANAR OPTICAL COMPONENT, AND A COUPLING DEVICE FOR COUPLING LIGHT BETWEEN A PLANAR OPTICAL COMPONENT AND AN OPTICAL ASSEMBLY

BACKGROUND OF THE INVENTION

FIELD OF THE INVENTION

The invention relates to a planar optical component having a multiplicity of optical conductors whose light-guiding core regions run in at least two layers disposed parallel to one another, a coupling device for coupling light between such a planar optical component and an optical assembly, as well as a configuration having such a planar optical component and such a coupling device.

Optical parallel connections (parallel optical interconnects (POIs)) are used, in particular, for high-speed connections in local networks such as local area networks (LANs)) and system networks such as system area networks (SANs)). A known system is marketed by Infineon Technologies AG under the designation trademark PAROLI. A transmitter module with a VCSEL transmitter row, and a receiver module with a photodiode receiver row are connected to one another in this case via fiber ribbons.

The connection of individual printed circuit boards of a rack cabinet is usually performed via the backplane of the rack cabinet. It is known to use optical parallel connections in order to avoid or reduce complicated electrical wiring. In this case, plug bushings in the backplane are used in each case to make contact with optical modules that are mounted on the printed circuit boards. The backplane wiring is then performed with the aid of individual optical waveguide cables. A problem consists in the volume of data, which is limited technically in mechanical terms by the prescribed area of the backplane.

In view of the continuously rising volumes of data, there is a need for structures that can be used in parallel optical interconnects, and in particular for connecting printed circuit boards, which take account of an increased demand on transmission bandwidth.

SUMMARY OF THE INVENTION

It is accordingly an object of the invention to provide a planar optical component, and a coupling device for coupling light between a planar optical component and an optical assembly that overcomes the above-mentioned disadvantages of the prior art devices of this general type, which permit high-volume data transmission in parallel optical interconnects and, for this purpose, provide a high measure of parallelism.

With the foregoing and other objects in view there is provided, in accordance with the invention, a planar optical component. The planar optical component contains a surface, a multiplicity of optical conductors having light-guiding core regions running in at least two layers disposed parallel to one another, and deflecting devices disposed in a two-dimensional grid in a projection onto a plane parallel to the surface. Each of the optical conductors is associated with one of the deflecting devices. The deflecting devices launch or couple out light at an angle to a longitudinal direction of the optical conductors.

In accordance therewith, the planar optical component according to the invention is distinguished in that a multiplicity of optical conductors run in at least two layers disposed parallel to one another. Each optical conductor is assigned a deflecting device that launches or couples out light at an angle to the longitudinal direction of the respective optical conductor. The deflecting devices form a two-dimensional grid in the projection onto a plane parallel to the surface of the planar optical component.

A planar optical component is thereby provided that is of multilayer construction and in this case has structures that permit coupling of the optical conductors of the planar optical component to the optical conductors of a two-dimensional optical array plug. This provides a higher measure of parallelism and permits a high transmission rate.

The planar optical component is, in particular, a multi-layer optical printed circuit board that is used, for example, as a backplane in a rack cabinet.

In a preferred refinement, the deflecting devices assigned to an optical layer are disposed along a straight line. The deflecting devices of different layers of the optical component are preferably disposed offset from one another. This produces in the projection onto the surface of the planar optical component a two-dimensional grid with a high density of data lines.

The deflecting devices each preferably have reflection regions that reflect the light guided in the optical conductors in the direction of the surface of the planar optical component. The reflection region of the deflecting devices is preferably disposed here in each case at an angle of substantially 45° to the longitudinal direction of the respective optical conductor, such that the light is substantially launched or coupled out at a right angle to the surface of the planar component.

The deflecting devices are preferably formed by separate mirrors embedded in the respective layer. The light launched or coupled out by a deflecting device in this case transilluminates the respectively higher layers.

Alternatively, it is provided that the planar structure has cutouts on its surface in such a way that the light respectively coupled out by the deflecting devices traverses a free beam region up to the surface of the component. This avoids damping of the launched or coupled-out light in the layers situated there-above.

In a further refinement, it is provided that the deflecting devices are formed by a wedge-shaped cutout introduced into the component, which cutout has a silvered boundary surface running at an angle of substantially 45° to the longitudinal direction of the optical conductors. The light reflected at the boundary surface transilluminates the layers situated there-above in each case. The cutout is formed, for example, by milling, etching or laser ablation of the component.

It is likewise within the scope of the invention that the deflecting devices are constructed in a separate component that is inserted into a cutout in the planar optical component, or adjoins an edge region of the planar optical component. The component is, by way of example, a mirror disposed at an angle of 45° that is disposed in a rectangular cutout in the component or adjoins the component. The light of the individual optical conductors in this case transilluminates a free beam region before impinging on the respective deflecting device. A simplified production of the deflecting devices is advantageously not a function of the planar optical component.

The planar optical component preferably has aligning devices for passive alignment of the optical component. These are, for example, bores in the optical component that serve to hold guide pins. The deflecting devices of each optical layer are preferably aligned with the aligning devices. As a result of this, the position of each deflecting device is accurately defined and adjusted both with reference to the position of the other deflecting device and with reference to a plug to be coupled that is positioned via the aligning device with reference to the planar optical component.

It is preferably provided that the individual optical layers of the planar optical component are produced separately in each case and then connected to one another. Thus, multilayer optical components with a multiplicity of layers can be produced in a simple way. The individual optical layers are formed of, for example, of plastic or glass.

A coupling device according to the invention serves to couple light between the planar optical component as described above and an optical assembly that has a multiplicity of coupling faces that form a two-dimensional grid. The coupling device has a lens array with a multiplicity of lenses disposed along a two-dimensional grid, the lenses of the lens array in each case coupling light between a deflecting device of an optical conductor of an assigned planar optical component and a coupling face of an assigned optical assembly.

The assigned optical assembly is preferably an optical plug that has a multiplicity of optical conductors. The optical coupling faces are in this case the optical conductor coupling faces, which form a two-dimensional grid. Basically, however, the optical assembly can also be, for example, an optoelectronic transmit or receive transducer with transmit or receive elements that are disposed in a two-dimensional grid, a transmit or receive element in each case forming a coupling face within the meaning of the invention.

The coupling device according to the invention permits, in particular, the coupling of a two-dimensional optical array plug to a multilayer planar optical component, a parallelism of the data transmission in accordance with the invention resulting in two dimensions.

The lens array is preferably constructed in such a way that there is implemented a different projection of the light onto the respectively assigned coupling face. As a result, the different spacing of the deflecting devices of the individual optical layers of the assigned planar optical component from the surface thereof is equalized. Several alternatives are provided for this purpose.

In a first alternative, the individual lenses of the lens array have the same projecting behavior, the optical projection of the end face of a coupled component, in particular optical plug, being positioned approximately at the mean depth of the optical layers. This configuration is particularly simple. The optical launching into the uppermost and lowermost layers of the planar optical component is, however, somewhat poorer than in the case of the middle layers, because of the expansion of the beam path.

In a second alternative, the lenses of each row of the lens array that are assigned to a specific optical layer have a focal position adapted to the spacing of the optical layer from the surface of the planar optical component. A precise projection is therefore performed between the deflecting device and the assigned coupling face. It is true that the magnification in the optical projection differs for each layer. However, this is of subordinate importance as long as the optical coupling suffices.

In a third alternative, the lenses of each row of the lens array that are assigned to a specific optical layer have, by comparison with the lenses of other rows, a different spacing from the surface of the assigned planar optical component in such a way that the beam path in the lens bodies is parallel in each case. The lenses can all have the same refractive power in this case. The nearer an optical layer is to the surface of the planar optical structure the greater will be the spacing of the associated lenses of the lens array from the surface. Moreover, the lenses of each row of the lens array have preferably a different lens thickness by comparison with the lenses of other rows in such a way that equal scale ratios are obtained for all the layers.

The lens array preferably has an aligning device that lines up with the aligning device of the assigned planar optical component. For this purpose, there are provided, for example, two bores in the body of the lens array that line up with the corresponding bores of the assigned planar optical component. The lens array and the planar optical component can be aligned with one another via guide pins inserted into the respective bores.

The lens array is preferably mounted in a plug receptacle for holding a two-dimensional optical plug. Moreover, the plug receptacle preferably forms latching elements for latching such an optical plug.

The lens array can preferably be connected permanently to the assigned optical component by soldering, bonding or by use of latching elements, for example. The lens array, the plug receptacle and the guide pins can in this case form a structural unit that is connected to the planar optical component.

Finally, the invention also relates to a configuration having the planar optical component and the coupling device, in which the coupling device is connected to the planar optical component in such a way that in each case a deflecting device of the planar optical component is assigned to a lens of the lens array of the coupling device. This is performed, for example, via the aligning device mentioned. The specific refinement of a multilayer planar optical component in conjunction with a two-dimensional lens array permits a two-dimensional optical plug to be coupled to a multilayer planar optical component, light preferably being launched or coupled out at a right angle to the surface of the planar optical component. The configuration is particularly suitable for coupling a two-dimensional optical plug to a multilayer optical backplane of a rack cabinet.

Other features which are considered as characteristic for the invention are set forth in the appended claims.

Although the invention is illustrated and described herein as embodied in a planar optical component, and a coupling device for coupling light between a planar optical component and the optical assembly, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a diagrammatic, plan view of a multilayer optical printed circuit board with a two-dimensional array of deflecting mirrors according to the invention;

FIG. 2 is a sectional view of the multilayer optical printed circuit board with a multiplicity of deflecting mirrors;

FIG. 3 is a sectional view of the multilayer optical printed circuit board with the multiplicity of deflecting mirrors, a free beam region being formed over each deflecting mirror;

FIG. 4 is a sectional view of the multilayer optical printed circuit board with a wedge-shaped cutout that forms a reflecting layer;

FIG. 6 is a sectional view of a first configuration having the multilayer optical printed circuit board, the lens array and an optical plug;

FIG. 7 is a sectional view of a second configuration having the multilayer optical printed circuit board, the lens array and the optical plug;

FIG. 8 is a sectional view of a third configuration having the multilayer optical printed circuit board, the lens array and the optical plug;

DESCRIPTION OF THE PREFERRED EMBODIMENTS

Figure 5A:
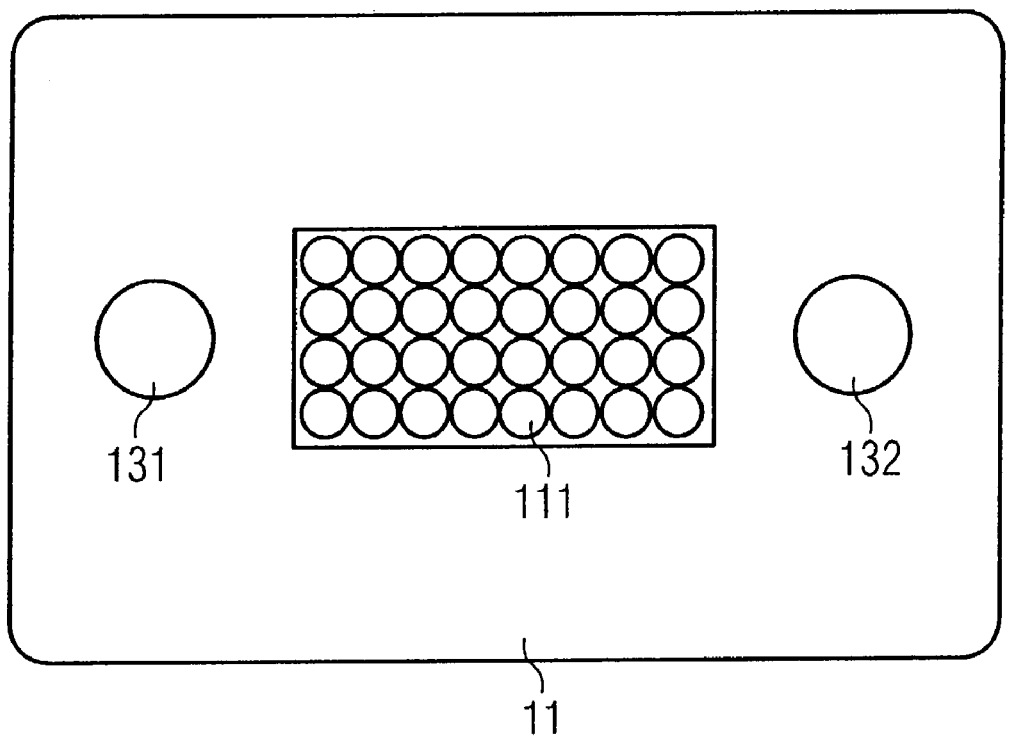
FIG. 5A is a plan view of a lens array.

Referring now to the figures of the drawing in detail and first, particularly, to FIG. 1 thereof, there is shown a plan view of a multilayer optical printed circuit board 1 having an multiplicity of optical conductors (wave-guides) 2 at whose ends a reflecting deflecting mirror 3 is disposed in each case. The wave-guides 2 run in different parallel planes or optical layers of the printed circuit board 1. A plurality of the waveguides 2 are located in this case in each optical layer. Wave-guide ends or the deflecting mirrors 3 assigned to the latter are disposed offset from one another from layer to layer such that the deflecting mirrors 3 form in the projection onto the surface of the planar optical component 1 a two-dimensional grid 4 that has 4×8 grid points in the exemplary embodiment illustrated.

As illustrated in FIG. 1, the grid is preferably such that the spacing between the grid points in both spatial directions of the grid is the same. However, the spacings can basically also differ from one another.

Two bores 51, 52 are disposed in the printed circuit board 1 in a symmetrical configuration relative to the grid 4 of the deflecting mirrors 3. The bores 51, 52 share the purpose, first, of aligning the printed circuit board 1 with reference to further components, and, second, of aligning the individual planes relative to one another. Thus, the individual planes of the printed circuit board 1 are produced in such a way that the waveguide ends or the deflecting mirrors 3 disposed on the latter have a defined alignment in each plane with reference to the bores 51, 52.

The multilayer optical printed circuit board 1 forms, for example, a backplane of a circuit housing. Further printed circuit boards of the circuit housing are respectively connected via a two-dimensional array plug to the backplane such that backplane cabling is eliminated. However, in principle, the printed circuit board can be used in any desired context in which data are to be transmitted with high parallelism, and there is to be a coupling between a multilayer planar optical component and an array plug and/or an optoelectronic module. It can also be provided, in particular in this case, that optoelectronic modules and further electric components are disposed on the printed circuit board. The optoelectronic modules launch light into the individual optical conductors 2, or decouple it from the latter.

The production of the planar optical component having the multiplicity of waveguides 2 in different layers can be performed in a plurality of ways. In the case of the use of multimode waveguides, production can be performed using the particularly simple plastic technology. In this case, a first layer of flat plastic is structured, for example, by hot embossing with the light-guiding core regions provided in this layer, together with the associated reflection surfaces or deflecting mirrors 3. The reflection surfaces are provided for this purpose with a corresponding silvering. It is perfectly possible for the silvering to be wavelength-selective in this case. Subsequently, the plastic material with the higher refractive index is knife-coated into the embossed trenches. A multilayer optical printed circuit board is produced by disposing a plurality of layers produced in this way one above another.

However, other methods of production are also conceivable. For example, the individual layers can be formed of thin glass layers with a thickness of 100 μm, for example, such as are commercially available. The individual waveguides can be introduced by etching and subsequent casting of a core material or else by diffusion and ion exchange.

FIG. 2 shows a first example for the implementation of a planar optical component in accordance with FIG. 1, in a lateral sectional view. The section is in this case taken along the line II—II shown in FIG. 1, and therefore positioned such that a plurality of waveguides 2 are also sectioned. In the exemplary embodiment illustrated, four waveguide planes or layers 1a, 1b, 1c, 1d are disposed one above another on a substrate 6. Each layer 1a, 1b, 1c, 1d has a plurality of optical conductors in the form of strip waveguides. In the sectional illustration, an optical conductor with a light-guiding core, 21a, 21b, 21c, 21d is to be seen in each case. Disposed offset in each layer 1a, 1b, 1c, 1d are the reflecting mirrors 3 that in each case couple out or—in the case of a reverse beam path—launch light of the associated waveguide 2 at right angles to a longitudinal direction of the optical conductor and thus perpendicular to a surface 101 of the planar optical component. The light respectively transilluminates the layers situated above in this case. The mirrors 3 are constructed in each case as separate elements.

FIG. 3 shows an alternatively constructed optical printed circuit board 1' with reflecting surfaces 3. Provided in accordance therewith in the optical printed circuit board 1' is a cutout 7 that is formed by virtue of the fact that there are formed in the individual waveguide planes 1a', 1b', 1c', 1d' cutouts that adjoin the respective reflecting mirrors 3. The individual layers 1a', 1b', 1c', 1d' are offset in this case in such a way that in each case no waveguide material is located over the individual mirrors 3 of the individual layers. The light coupled out or launched is therefore not damped by layers situated above. The free beam region provided by the cutout 7 can, if desired, also be filled by an optically transparent material.

In the exemplary embodiment of FIG. 4, the reflecting mirrors are provided by a wedge-shaped cutout 8 that converges in the direction of a surface 101" of an optical printed circuit board 1", and forms in the printed circuit board 1" a silvered coupling face 81 running at an angle of substantially 45°. The cutout 8 is constructed, for example, by milling, laser ablation or etching. The coupling face 81 running at an angle of 45° is silvered from behind after introduction into the printed circuit board material, such that it provides a multiplicity of reflecting mirrors for the individual optical conductor core regions 21a", 21b", 21c", 21d".

Figure 10:
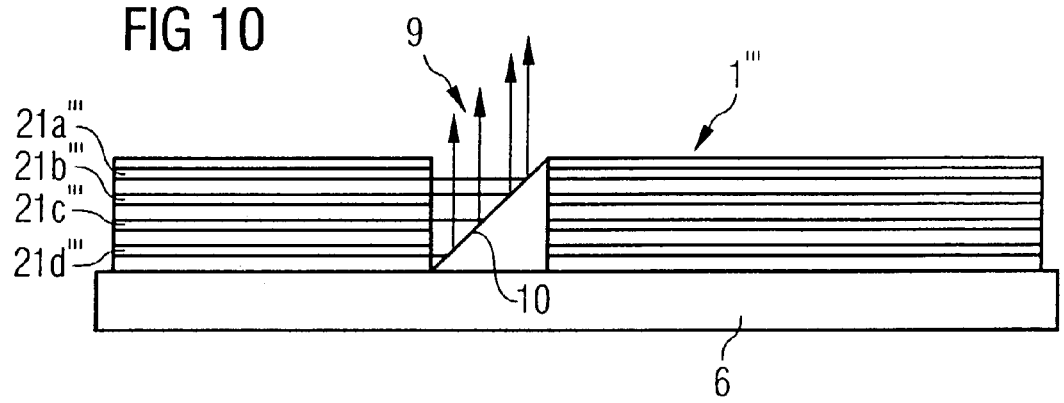
FIG. 10 is a sectional view of the multilayer optical printed circuit board having a cutout in which an obliquely running mirror is disposed.

A further exemplary embodiment is shown in FIG. 10. According thereto, there is provided in a printed circuit board 1''', a cutout 9 in which a mirror 10 extends which runs at an angle of 45°. The light exits in each case from the optical conductors 21a''', 21b''', 21c''' and 21d''', and is reflected upward after traversing a free beam region through the mirror 10 that provides a multiplicity of deflecting mirrors. This refinement is particularly simple, since the deflecting mirrors need not be integrated in the optical printed circuit board 1'''. An additional beam widening is disadvantageous because of the free beam region after exiting of the light from the respective waveguide. The cutout 9 can be filled with an optically transparent material.

Instead of the mirror 10, it is also possible to use another structure with a multiplicity of individually constructed deflecting mirrors. In this case each deflecting mirror can be furnished with separate optical projecting properties, for example can be of focusing construction. Each deflecting mirror can, for example, implement a focusing effect whose strength is a function of the layer to which the mirror is aligned and, if appropriate, also of the length of the free beam region that the light traverses before impinging on the mirror.

The mirror 10 or the other structure can also alternatively be disposed to the side of the edge of the printed circuit board 1'''.

Figure 5B:
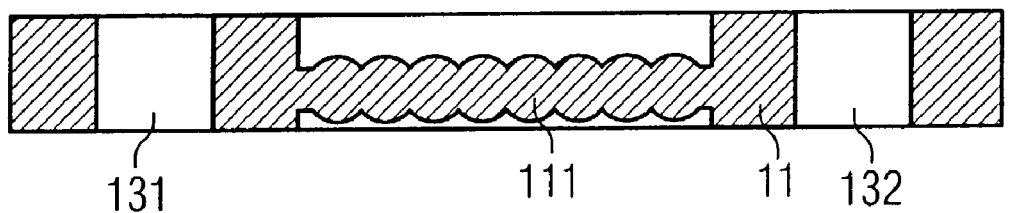
FIG. 5B is a sectional view of the lens array.

FIGS. 5A and 5B shows a plan view and a section of a two-dimensional lens array 11 with a multiplicity of lenses 111 that are disposed along a grid. In the exemplary embodiment illustrated, the grid is identical to the grid 4 of the deflecting mirrors 3 of the optical printed circuit board of FIGS. 1 to 4.

The lens array 11 is preferably disposed between the multilayer optical printed circuit board 1 and a two-dimensional optical multiple plug, and couples the light between the respective deflecting mirrors 3 of the printed circuit board 1 and individual optical conductor coupling faces that form the optical plug in a way known per se.

The lens array 11 has two bores 131, 132 that are of the same size and have the same spacing as the bores 51, 52 of the printed circuit board 1, such that the printed circuit board 1 and the lens array 11 can be fixed and aligned with one another via guide pins inserted into the bores 51, 52, 131, 132. When the lens array 11 is mounted on the printed circuit board 1, the lens array 11 is automatically aligned in this case with the reflecting surfaces 3 of the printed circuit board 1.

The deflecting mirrors 3 of the individual layers 1a, 1b, 1c, 1d of the optical printed circuit board 1 naturally have a different spacing from the surface 101 of the component. It follows from this that the radiation, reflected at the deflecting mirrors 3, of the individual optical conductors experience a different beam expansion up to the coupling with the associated lens of the lens array 11, depending on in which layer or at which depth the waveguide is located. This can lead to problems in focusing the light beam onto the associated coupling face of an optical conductor of an optical plug. A plurality of alternative configuration variants that avoid or reduce such problems are explained below.

FIGS. 6 to 8 illustrate diagrammatically the optical printed circuit board 1, the lens array 11 and an optical plug 12 that has a multiplicity of optical conductors 123 in a two-dimensional array configuration. Light is coupled in each case via the lenses 111 of the lens array 11 between end faces 122 of the optical conductors 123 of the plug 12 and the deflecting mirrors 3 of the optical conductors of the optical printed circuit board 1. It may be pointed out in this case that the deflecting mirrors can also be constructed in accordance with the refinements of FIGS. 2, 3 and 10, or in another way.

In accordance with FIG. 6, the lenses 111 of the lens array 11 are of identical construction. This advantageously permits a particularly simple production of the lens array 11. The lenses 111 are constructed in this case in such a way that the optical projection of the plug end face 121 of the coupled optical plug 12 is positioned approximately in the middle one of the optical layers 1a, 1b, 1c, 1d. Thus, for the light of the wave-guides of the middle optical layers 1b, 1c an ideal projection is performed onto the corresponding coupling faces 122 of the optical conductors 123 of the optical plug 121. Because of the expansion of the beam path, the optical coupling between the light of the waveguides on the upper and lower layers 1a, 1d is somewhat poorer than in the middle layers, but still acceptable.

A configuration with an alternative refinement of a lens array 11' is illustrated in FIG. 7. It may first be pointed out in this case that each row 111a', 111b', 111c', 111d' of the lens array 11' is assigned to a row of deflecting mirrors of a layer 1a, 1b, 1c, 1d of the planar optical component 1. It is provided that each lens row 111a', 111b', 111c', 111d' of the lens array 11' is constructed in such a way that the focal position differs in each case and is tuned to the spacing of the deflecting device 3 assigned to the lenses. It is therefore to be seen that the lenses 111a' disposed on the left in FIG. 4 effect less focusing than the lenses 111d' of the lens array that are disposed on the right.

It is disadvantageous in this configuration that the magnification during the optical projection differs for each optical layer 1a, 1b, 1c, 1d. However, this is of subordinate importance as long as the optical coupling is sufficient.

FIG. 8 shows another variant in which the beam path in the lenses of the individual rows 111a'', 111b'', 111c'', 111d'' of the lens array 11'' are configured in such a way that the beam path runs parallel in each case in the lens body. Consequently, each row of the lens array has a different spacing from the printed circuit board 1 and a different lens thickness. The different spacing of the lenses from the printed circuit board 1 ensures that despite the equal refractive power of the lenses, the light of each layer in the lens body is guided in parallel. The different thickness of the lenses provides a standard spacing from the optical plug 12. The result is an adapted height gradation of the lens surfaces to the optical layers of the printed circuit board 1. Despite the differences in spacing, equal scale ratios are thereby provided for the waveguides of all the layers 1a, 1b, 1c, 1d.

It is also possible to use combinations of the embodiments, illustrated in FIGS. 7 and 8, of the lens array, that is to say the lenses of the individual rows have both a different focal length and a different lens thickness.

The lenses of the lens array 11, 11', 11'' are produced, for example, from optically transparent plastics by precision casting technology. In the case of the variants of FIGS. 6 and 7, it is also possible to use other production methods and, for example, to use graded-index lenses or Fresnel lenses produced by ion exchange.

Figure 9:
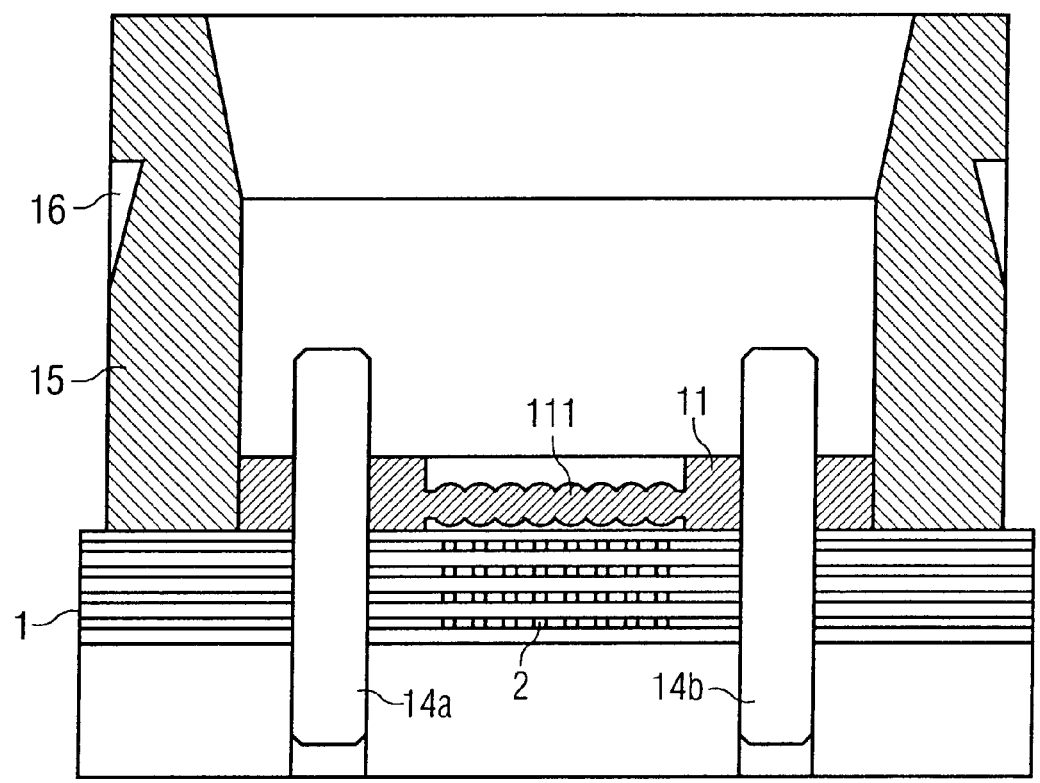
FIG. 9 is a sectional view of a plug unit with the multilayer optical printed circuit board, the lens array and a plug receptacle.

FIG. 9 shows all the essential components of a configuration that contains the optical printed circuit board 1 and the lens array 11. The printed circuit board 1 and the lens array 11 are fixed to one another via guide pins 14a, 14b inserted into respective bores, and aligned with one another in such a way that the respective grids formed by the lenses 111 or by deflecting mirrors are situated one above another. Since the guide pins 14a, 14b project over the lens array 11 in the direction of a plug to be coupled, they serve additionally to center a plug to be coupled that is provided with a fiber array.

The lens array is mounted permanently in an outer plug socket 15 or plug receptacle. The plug socket 15 has the task of bringing forward an optical plug to be coupled during a plugging operation. It can be configured as a funnel as shown in FIG. 9, for example, but in a departure therefrom, can also include mutually tuned centering stages. Moreover, function elements 16 for latching the optical plug to be coupled with the plug socket 15 are provided in the plug socket.

The plug socket 15, the lens array 11 and the plug pins 14a, 14b form a permanent structural transmission unit in the exemplary embodiment illustrated. During mounting, the unit is placed on the multilayer optical printed circuit board 1 with the aid of the plug pins 14a, 14b and centered in the process. The transmission unit can be fixed on the printed circuit board 1 by bonding or else by soldering. In the latter case, parts of the surfaces of the printed circuit board and the transmission unit have suitable metallic coatings. It can also be provided that the transmission unit and the printed circuit board 1 have form-fitting elements such as latching hooks and corresponding openings such that the transmission unit can also be connected latchably to the printed circuit board 1.

I claim:

1. A planar optical component, comprising:
   a surface;
   a multiplicity of optical conductors having light-guiding core regions running in at least two layers disposed parallel to one another; and
   deflecting faces disposed in a two-dimensional grid in a projection onto a plane parallel to said surface, each of said optical conductors associated with one of said deflecting faces, said deflecting faces launching or coupling out light at an angle to a longitudinal direction of said optical conductors, said deflecting faces being an integral part of the planar optical component and disposed within said layers.

2. The optical component according to claim 1, wherein said deflecting faces assigned to a respective one of said layers are disposed along a straight line.

3. The optical component according to claim 1, wherein said deflecting faces disposed in different ones of said layers are disposed offset from one another.

4. The optical component according to claim 1, wherein said deflecting faces have reflection regions reflecting the light guided in said optical conductors in a direction of said surface.

5. The optical component according to claim 4, wherein said reflection regions of said deflecting faces are disposed in each case at an angle of substantially 45° to the longitudinal direction of a respective one of said optical conductors.

6. The optical component according to claim 1, wherein said deflecting faces are formed by separate mirrors embedded in a respective one of said layers.

7. The optical component according to claim 6, wherein said separate mirrors are formed by hot embossing said light-guiding core regions of said optical conductors.

8. The optical component according to claim 1, wherein said layers of said optical conductors form a planar structure, said planar structure having cutouts formed therein such that the light respectively coupled out by said deflecting faces traverses a free beam region up to said surface.

9. The optical component according to claim 1, further comprising a structure with said optical conductors disposed in said structure, said structure with said optical conductors having a wedge-shaped cutout formed therein and functioning as said deflecting faces, said wedge-shaped cutout having a silvered boundary surface running at an angle of substantially 45° to the longitudinal direction of said optical conductors, the light reflected at said silvered boundary surface transilluminating said layers situated there-above in each case.

10. The optical component according to claim 9, wherein said wedge-shaped cutout is formed by milling, etching or laser ablation of said structure.

11. The optical component according to claim 1, further comprising a structure having said optical conductors disposed therein, said structure having a cutout formed therein, and said deflecting faces are constructed as a separate component disposed one of in said cutout and adjoins an edge region of said structure.

12. The optical component according to claim 1, further comprising aligning devices for passive alignment of the optical component.

13. The optical component according to claim 12, wherein said deflecting faces of each of said layers are aligned with said aligning devices.

14. The optical component according to claim 12, further comprising a structure having said optical conductors disposed thereon, said structure having bores formed therein and said bores functioning as said aligning devices by receiving and holding guide pins.

15. The optical component according to claim 1, wherein said layers are produced separately in each case and then connected to one another.

16. The optical component according to claim 1, wherein said multiplicity of optical conductors form a multilayer optical printed circuit board.

17. The optical component according to claim 16, wherein said multilayer optical printed circuit board is a backplane of a rack cabinet.

18. The optical component according to claim 1, wherein said deflecting faces are disposed in said two-dimensional grid at crossover points of regularly spaced horizontal and vertical lines of said two-dimensional grid.

19. The optical component according to claim 1, wherein said optical conductors in said at least two layers all run parallel to each other.

20. A planar optical component, comprising:
   a surface;
   a multiplicity of optical conductors having light-guiding core regions running in at least two layers disposed parallel to one another;
   deflecting faces disposed in a two-dimensional grid in a projection onto a plane parallel to said surface, each of said optical conductors associated with one of said deflecting faces, said deflecting faces launching or coupling out light at an angle to a longitudinal direction of said optical conductors, said deflecting faces being an integral part of the planar optical component and disposed within said layers; and
   a structure having said optical conductors disposed therein, said structure having a cutout formed therein, all of said deflecting faces in all of said layers constructed as a single separate component disposed one of in said cutout and adjoining an edge region of said structure.

* * * * *